(12) United States Patent  
Sutardja

(10) Patent No.: US 6,633,197 B1  
(45) Date of Patent: Oct. 14, 2003

(54) GATE CAPACITOR STRESS REDUCTION IN CMOS/BICMOS CIRCUIT

(75) Inventor: Pantas Sutardja, San Jose, CA (US)

(73) Assignee: Marvell International, Ltd., Hamilton (BM)

( * ) Notice: Subject to any disclaimer, the term of this patent is extended or adjusted under 35 U.S.C. 154(b) by 146 days.

(21) Appl. No.: 09/697,714

(22) Filed: Oct. 27, 2000

(51) Int. Cl.⁷ .............................................. H03K 17/795
(52) U.S. Cl. ...................... 327/530; 327/538; 327/534; 361/111; 257/532
(58) Field of Search ................. 361/271, 272, 361/111; 257/296, 532, 595, 23; 327/530, 538, 379

(56) References Cited

U.S. PATENT DOCUMENTS

| | | | |
|---|---|---|---|
| 5,434,531 A | 7/1995 | Allen et al. | 327/530 |
| 5,530,394 A | 6/1996 | Blossfeld et al. | 327/530 |
| 5,744,996 A | 4/1998 | Kotzle et al. | 327/534 |
| 5,767,733 A | 6/1998 | Grugett | 327/534 |
| 5,805,006 A | 9/1998 | Sutardja et al. | 327/336 |
| 5,821,769 A | 10/1998 | Douseki | 326/34 |
| 5,939,934 A | 8/1999 | So et al. | 327/534 |
| 5,945,866 A | 8/1999 | Fonash et al. | 327/427 |
| 5,969,564 A | 10/1999 | Komatsu et al. | 327/534 |
| 6,013,932 A | 1/2000 | Chevallier | 257/392 |
| 6,388,511 B1 * | 5/2002 | Kanao | 327/558 |

* cited by examiner

*Primary Examiner*—Kim Huynh

(57) ABSTRACT

Method and apparatus for using a MOSFET having a thin gate oxide layer as a gate capacitor is provided. The method includes the steps of biasing at least one of a source and a drain of the MOSFET by applying a nonzero voltage to the source and the drain, and applying a voltage to a gate of the MOSFET. The voltage applied to the gate is greater than a voltage rating of the MOSFET but less than the sum of the voltage rating and the voltage applied to the source and the drain. The gate of the MOSFET may have a length that measures at least 150.0 nanometers and no more than 350.0 nanometers. The thin gate oxide layer may have a thickness that measures at least 2.00 nanometers and no more than 7.00 nanometers. The MOSFET may be constructed using CMOS technology or BiCMOS technology. Apparatuses implementing this method include a capacitor, a read channel for a hard disk drive, and an electrical circuit for amplification of a signal.

61 Claims, 2 Drawing Sheets

GATE CAPACITOR STRESS REDUCTION IN CMOS/BICMOS CIRCUIT

BACKGROUND OF THE INVENTION

1. Field of the Invention

The present invention relates to a method and apparatus for reducing gate capacitor stress in an analog circuit, and may be implemented in deep sub-micron CMOS/BiCMOS with a very thin gate oxide layer.

2. Description of the Related Art

Many different analog functions have been implemented in a metal oxide semiconductor field effect transistor (MOSFET) structure through the use of CMOS and BiCMOS technology. Referring to FIGS. 1 and 2, a capacitor 100 (comprising a gate 105 of the FET 200) is one of the passive elements commonly used in analog circuits. FIG. 2 shows a standard illustration of the symbol for a MOSFET, including the gate 105, the source 110, and the drain 115. Often, the size of the capacitors required can be quite large. The resulting MOSFET area required increases proportionally with the capacitance required. For purposes of cost reduction, it is desirable to find ways to reduce the size of MOSFETs used in large capacitors.

As gate length decreases in a deep sub-micron MOSFET device, the gate thickness of the MOSFET also decreases to improve the speed performance of the device. This results in correspondingly lower breakdown voltages for the gate oxide. Many sub-micron CMOS processes offer dual gate oxides to support transistors with two different kinds of operating voltages. For example, see U.S. Pat. Nos. 5,434,531; 5,530,394; 5,744,996; 5,767,733; 5,821,769; and 5,939,934, the contents of each of which are incorporated herein by reference. The lower voltage devices are typically used for implementing high speed/low power digital circuitry, which can easily run at lower voltages. The thicker gate oxide transistors are made available to ease the implementation of analog functions with a certain topology that requires higher voltage operation. In a number of analog functional blocks, fairly large capacitors to ground, or virtual ground, are required. An example is a capacitor used in a gm/C filter, as described in U.S. Pat. No. 5,805,006, the contents of which are incorporated herein by reference. It is possible to implement these capacitors using the thicker gate oxide transistors, which can sustain higher gate breakdown voltage. However, it can be very advantageous to use the thinner gate oxide MOSFETs for the gate capacitor.

Without taking any special precautions, the use of a thinner gate limits the usable gate voltage to the upper voltage limit recommended by the chip manufacturer. In many analog functions, this may not be impractical. For example, it is supposed that in a particular analog gm/C filter implementation, it is desirable to set the common mode output voltage to 1.8 V. Assuming that the process used is a 3.3 V/1.5 V 0.15 μm CMOS process, a thin gate oxide transistor may only work reliably up to 1.5 V of voltage stress. Therefore, assuming that the source 110 and drain 115 are biased at 0 V (as is generally the case, because this ensures that the FET channel is strongly inverted), the 1.8-V common mode voltage is too high for the thin gate oxide grounded capacitor. Using a thicker gate oxide MOSFET would solve this problem because it would safely handle up to 3.3 V of voltage stress. The area of the thick gate oxide used can be more than double the area of a thin gate oxide capacitor.

In view of the foregoing, the present inventors have recognized a need for an implementation of a gate capacitor using a MOSFET having a thin gate oxide and allowing for high values of voltage stress that might otherwise cause the MOSFET to break down.

SUMMARY OF THE INVENTION

The present invention is intended to overcome the drawbacks noted above and implements a gate capacitor using a MOSFET having a thin gate oxide layer and allowing for high values of voltage stress that might otherwise cause the MOSFET to break down.

In one aspect, the invention provides a capacitor. The capacitor includes a thin gate oxide layer semiconductor device having a gate oxide layer, means for biasing at least one of a source and a drain of the semiconductor device by applying a nonzero voltage to one of the source and the drain, and means for applying a voltage to a gate of the semiconductor device. The applied gate voltage is greater than a voltage rating of the semiconductor device but less than the sum of the voltage rating and the voltage applied to one of the source and the drain. The gate of the semiconductor device may have a length that measures at least 150.0 nanometers and no more than 350.0 nanometers. The gate oxide layer may have a thickness that measures at least 2.00 nanometers and no more than 7.00 nanometers. The semiconductor device may be a MOSFET, and it may be manufactured using CMOS technology or BiCMOS technology.

In another aspect of the invention, a read channel for a hard disk drive includes a thin gate oxide layer semiconductor device having a gate oxide layer, the semiconductor device being used as a gate capacitor. The read channel also includes means for biasing at least one of a source and a drain of the semiconductor device by applying a nonzero voltage to one of the source and the drain, and means for applying a voltage to a gate of the semiconductor device. The applied gate voltage is greater than a voltage rating of the semiconductor device but less than the sum of the voltage rating and the voltage applied to one of the source and the drain. The gate of the semiconductor device may have a length that measures at least 150.0 nanometers and no more than 350.0 nanometers. The gate oxide layer may have a thickness that measures at least 2.00 nanometers and no more than 7.00 nanometers. The semiconductor device may be a MOSFET, and it may be manufactured using CMOS technology or BiCMOS technology.

In yet another aspect of the invention, an electrical circuit for amplification of a signal includes a thin gate oxide layer device having a gate oxide layer, the semiconductor device being used as a gate capacitor. The circuit also includes means for biasing at least one of a source and a drain of the semiconductor device by applying a nonzero voltage to one of the source and the drain, and means for applying a voltage to a gate of the semiconductor device. The applied gate voltage is greater than a voltage rating of the semiconductor device but less than the sum of the voltage rating and the voltage applied to one of the source and the drain. The gate of the semiconductor device may have a length that measures at least 150.0 nanometers and no more than 350.0 nanometers. The gate oxide layer may have a thickness that measures at least 2.00 nanometers and no more than 7.00 nanometers. The semiconductor device may be a MOSFET, and it may be manufactured using CMOS technology or BiCMOS technology.

In still another aspect of the invention, an apparatus for using a thin gate oxide layer semiconductor device having a gate oxide layer as a gate capacitor includes means for biasing at least one of a source and a drain of the semiconductor device by applying a nonzero voltage to one of the source and the drain, and means for applying a voltage to a gate of the semiconductor device. The voltage applied to the gate is greater than a voltage rating of the semiconductor device but less than the sum of the voltage rating and the voltage applied to one of the source and the drain. The gate of the semiconductor device may have a length that measures at least 150.0 nanometers and no more than 350.0 nanometers. The gate oxide layer may have a thickness that measures at least 2.00 nanometers and no more than 7.00 nanometers. The semiconductor device may be a MOSFET, and it may be manufactured using CMOS technology or BiCMOS technology.

In yet another aspect of the invention, an apparatus for preventing voltage breakdown in a thin gate oxide layer semiconductor device being used as a gate capacitor and having a gate oxide layer is provided. The apparatus includes means for applying an input signal having a voltage to a gate of the semiconductor device, means for biasing at least one of a source and a drain of the semiconductor device by applying a nonzero voltage to one of the source and the drain, and means for applying a reference voltage to a substrate to which the semiconductor device is connected. The means for biasing at least one of a source and a drain of the semiconductor device applies a voltage to one of the source and the drain which is less than the sum of the applied reference voltage and a threshold voltage of the semiconductor device, but greater than the difference between the input signal voltage and the voltage rating of the semiconductor device. The gate of the semiconductor device may have a length that measures at least 150.0 nanometers and no more than 350.0 nanometers. The gate oxide layer may have a thickness that measures at least 2.00 nanometers and no more than 7.00 nanometers. The semiconductor device may be a MOSFET, and it may be manufactured using CMOS technology or BiCMOS technology.

In still another aspect of the invention, a method of using a thin gate oxide layer semiconductor device having a gate oxide layer as a gate capacitor is provided. The method includes the steps of biasing at least one of a source and a drain of the semiconductor device by applying a nonzero voltage to one of the source and the drain, and applying a voltage to a gate of the semiconductor device. The voltage applied to the gate is greater than a voltage rating of the semiconductor device but less than the sum of the voltage rating and the voltage applied to one of the source and the drain. The gate of the semiconductor device may have a length that measures at least 150.0 nanometers and no more than 350.0 nanometers. The gate oxide layer may have a thickness that measures at least 2.00 nanometers and no more than 7.00 nanometers. The semiconductor device may be a MOSFET, and it may be manufactured using CMOS technology or BiCMOS technology.

In yet another aspect of the invention, a method of preventing voltage breakdown in a thin gate oxide layer semiconductor device being used as a gate capacitor and having a gate oxide layer is provided. The method includes the steps of applying an input signal having a maximum voltage to a gate of the semiconductor device, biasing at least one of a source and a drain of the semiconductor device by applying a nonzero voltage to the source and the drain, and applying a reference voltage to a substrate to which the semiconductor device is connected. The bias voltage applied to at least one of the source and the drain is less than the sum of the applied reference voltage and a threshold voltage of the semiconductor device, but greater than the difference between the input signal voltage and the voltage rating of the semiconductor device. The gate of the semiconductor device may have a length that measures at least 150.0 nanometers and no more than 350.0 nanometers. The gate oxide layer may have a thickness that measures at least 2.00 nanometers and no more than 7.00 nanometers. The semiconductor device may be a MOSFET, and it may be manufactured using CMOS technology or BiCMOS technology.

DETAILED DESCRIPTION OF THE INVENTION

The present invention will be described with respect to a gate capacitor constructed from a MOSFET having a thin gate oxide layer, as used in a read channel of a hard disk drive. However, the invention may also be used in many capacitor applications. An example of another application for the present invention is a circuit for amplification of a signal, such as an operational amplifier. The present invention may be useful in any electrical or electronic circuit that uses a capacitor. It is noted that two possible implementations of the present invention make respective use of CMOS technology and BiCMOS technology in the manufacture of the MOSFET. However, the invention may also be applied to other thin gate oxide layer semiconductor devices, including other types of MOSFETs and other methods of manufacturing MOSFETs.

Figure 1:
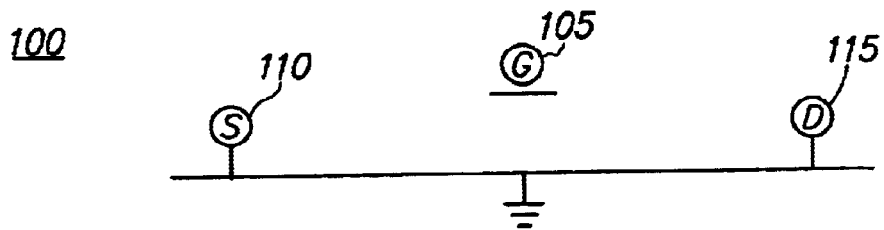
FIG. 1 is a block diagram that illustrates a MOSFET being used conventionally as a gate capacitor.
Figure 2:
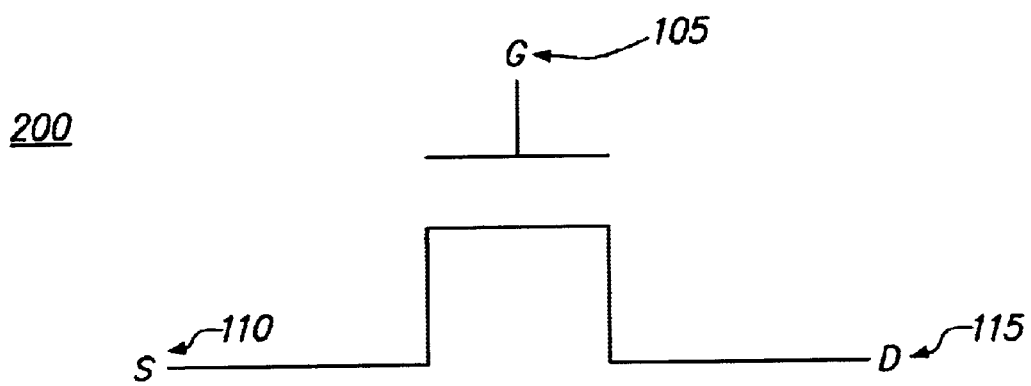
FIG. 2 is a illustration of a conventional schematic symbol for a MOSFET.
Figure 3:
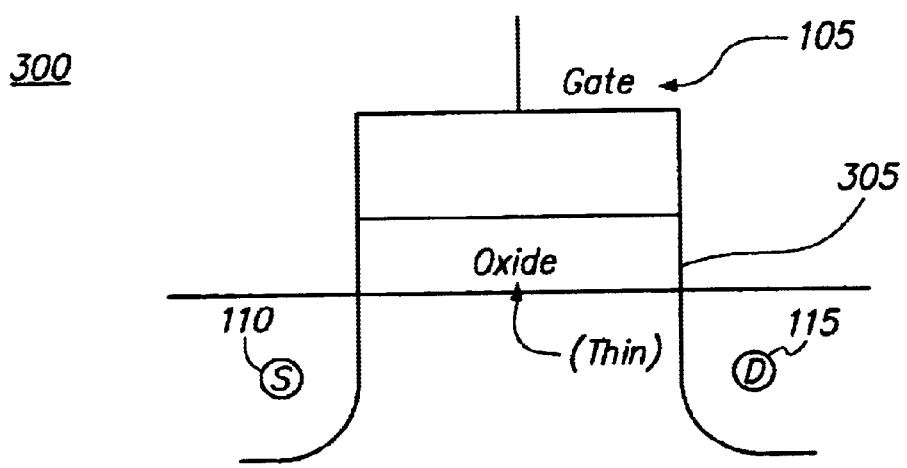
FIG. 3 is a diagram that illustrates a MOSFET having a thin gate oxide layer according to an embodiment of the present invention.

Referring to FIG. 3, a thin gate oxide capacitor 300 includes a very thin layer of oxide 305 between the gate 105 and the source/drain channel of a MOSFET. The capacitor 300 may be characterized by several quantities, including the gate length, the thickness of the gate oxide layer, and the capacitance. A preferred range of values for the gate length fall into the range 0.10 $\mu$m–0.50 $\mu$m; preferably, the gate length will vary within the 0.15 $\mu$m–0.35 $\mu$m range. For a capacitor 300 having a gate length of 0.15 $\mu$m, a typical value for the gate oxide layer thickness is 20 Å (1 $\mu$m =1000 nm =10,000 Å). For a capacitor 300 having a gate length of 0.18 $\mu$m, a typical range of values for the oxide layer thickness is 27–30 Å. For a capacitor 300 having a gate length of 0.25 $\mu$m, a typical range of values for the oxide layer thickness is 25–50 Å. For a capacitor 300 having a gate length of 0.35 $\mu$m, a typical value for the oxide layer thickness is 70 Å. In general, a preferred range for the thickness of the oxide layer for a thin gate oxide capacitor may be the 20–70 Å range. The actual capacitance can be computed using the equation $$C = \epsilon_r \epsilon_0 (A/T_{ox})$$

where $\epsilon_r \epsilon_0$=permittivity of the oxide, A=capacitor area, and $T_{ox}$=thickness of the oxide layer.

Figure 4:
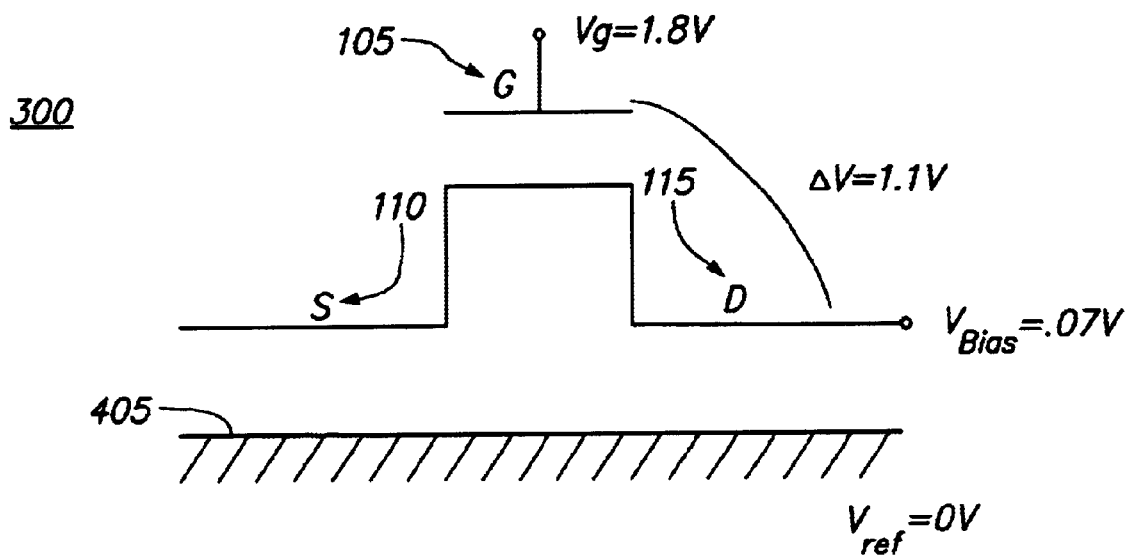
FIG. 4 is a diagram that shows a MOSFET being used as a gate capacitor and having the source/drain channel biased by application of a nonzero voltage, according to an embodiment of the present invention.

If the gate of a low voltage transistor, for example, a 1.5 V transistor in an N-WELL CMOS process, is subjected to 1.8 V of stress, then the whole gate oxide region sees the 1.8 V stress. Referring to FIG. 4, it is proposed that instead of biasing the source 110 and the drain 115 of such a transistor at zero volts as is normally the case, the source 110 and the drain 115 can be biased at a slightly higher voltage. The bias voltage $V_{Bias}$ (and each of the other applied voltages) is always measured relative to a reference voltage $V_{ref}$, which by definition is equal to a voltage level of a substrate 405 to which the MOSFET is connected. Generally, the substrate is at ground, and hence $V_{ref}=0$ V, as exemplified in FIG. 4; but it is not necessary that the substrate be at electrical ground. The bias voltage should not be too high so the channel is still strongly inverted, thus ensuring that the whole bottom plate of the gate capacitor is set at the bias voltage level. For example, as shown in FIG. 4, setting the source/drain voltage to $V_{Bias}=0.7$ V in the above example still allows the channel to be strongly inverted so that the gate capacitor 100 remains substantially unchanged. The substrate 405 is grounded to the zero voltage level. The benefit is that, if a voltage of $V_g=1.8$ V is applied to the gate, the gate oxide now sees a voltage stress of 1.8 V–0.7 V=1.1 V, sufficiently below the safe operating limit of the thin gate oxide transistor. Also, the source/drain channel potential is 0.7 V, which is well within the safe operating limit of junction breakdown for such a device.

More generally, if the gate is subjected to any voltage greater than the voltage rating for the MOSFET, this technique may be used effectively. It may be desirable to allow for voltages of up to approximately three volts greater than the voltage rating of the MOSFET to be applied to the gate for a thin gate oxide capacitor. By applying an appropriate bias to the source/drain channel (relative to the reference voltage of the substrate), the capacitor may be used effectively without causing the MOSFET to break down. The choice of an appropriate bias entails choosing a voltage level that simultaneously keeps the source/drain channel substantially inverted (i.e., the voltage level of the source/drain channel is less than the voltage level of the gate) and maintains a voltage difference between the gate and the source/drain channel which is less than the voltage rating of the transistor. The maximum bias value is equal to the threshold voltage of the MOSFET device itself.

Referring again to FIG. 4, it is noted that a voltage source for providing a bias voltage $V_{Bias}$ to the source/drain channel may be any voltage source, such as a biasing circuit or a battery. Likewise, a voltage source for the voltage applied to the gate $V_g$ may be any voltage source. Typically, the gate voltage $V_g$ will be a function of the, desired capacitor application, such as a read channel for a hard disk drive or an operational amplifier. An input signal having a voltage level equal to $V_g$ may also be applied to the gate.

Generally, in order to ensure that the source/drain channel remains strongly inverted, the difference between the voltage level of the source/drain channel and the gate should be at least a few tenths of a volt. Likewise, in order to ensure that the MOSFET does not break down, the difference between the voltage level of the source/drain channel and the gate should be slightly less than the voltage rating of the MOSFET.

Although the use of a thin gate oxide layer 305 limits the usable gate voltage, it also provides several advantages over thicker gate oxide layers. For example, it allows larger magnitudes of capacitance for a smaller capacitor area.

Figure 5:
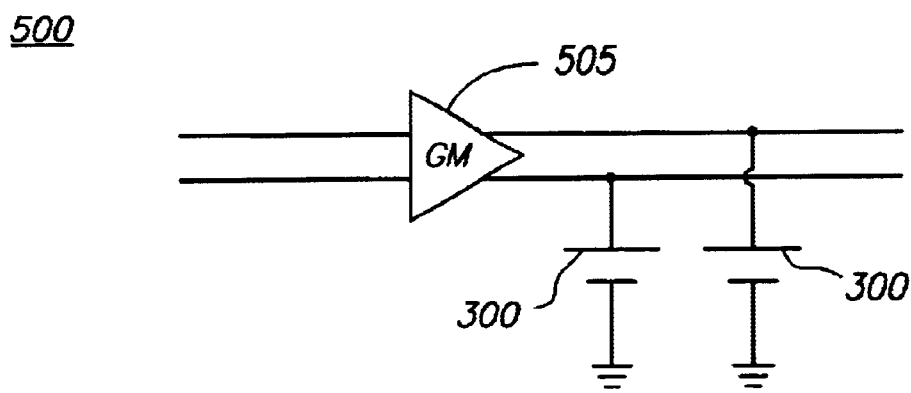
FIG. 5 is a circuit diagram that shows an operational amplifier application for a gate capacitor having a thin gate oxide layer.

These advantages lend themselves well to several applications for the gate capacitor 300. For example, referring to FIG. 5, a filter 500 may be constructed by connecting the output leads of an operational amplifier 505 to gate capacitors 300. The technique embodied in this invention is useful for any capacitor application that requires a small "footprint", i.e., a small capacitor area. Another example of an application for the gate capacitor 300 is as part of a read channel for a hard disk drive.

Thus, what has been described represents an implementation of a gate capacitor using a MOSFET having a thin gate oxide layer and allowing for high values of voltage stress that might otherwise cause the MOSFET to break down.

The individual components shown in outline or designated by blocks in the Drawings are all well-known in the electronics arts and their specific construction and operation are not critical to the operation or best mode for carrying out the invention.

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An integrated circuit, comprising:
a first circuit having one of an input and an output that at least one of receives and generates, respectively, a voltage that varies and that has a maximum voltage value;
a gate capacitor including a thin gate oxide layer semiconductor device with a gate, a source and a drain, wherein the gate communicates with the at least one of the input and the output of the first circuit, and wherein the semiconductor device has a voltage rating that is less than the maximum voltage value; and
a first bias supply that biases the source and the drain of the semiconductor device with a nonzero bias voltage that is substantially fixed and has a value that is greater than a difference between the maximum voltage value and the voltage rating.

2. The integrated circuit of claim 1, wherein the gate of the semiconductor device has a length that measures at least 150.0 nanometers and no more than 350.0 nanometers.

3. The integrated circuit of claim 1, wherein the gate oxide layer has a thickness that measures at least 2.00 nanometers and no more than 7.00 nanometers.

4. The integrated circuit of claim 1, wherein the semiconductor device is a MOSFET.

5. The integrated circuit of claim 1, wherein the semiconductor device is manufactured using CMOS technology.

6. The integrated circuit of claim 1, wherein the semiconductor device is manufactured using BiCMOS technology.

7. The integrated circuit of claim 1, wherein the source and drain are biased to substantially equal voltages.

8. The integrated circuit of claim 1, wherein the bias is selected such that a channel is strongly inverted.

9. The integrated circuit of claim 1, further comprising a second bias supply that applies a reference voltage to a substrate of the semiconductor device that is different than the voltage applied to the source and drain.

10. A read channel for a hard disk drive, comprising:
a first circuit having one of an input and an output that at least one of receives and generates, respectively, a voltage that varies and that has a maximum voltage value;

a gate capacitor including a thin gate oxide layer semiconductor device having a gate, a source and a drain, wherein the gate communicates with the at least one of the input and the output of the first circuit, and wherein the semiconductor device has a voltage rating that is less than the maximum voltage value; and a first bias supply that biases the source and the drain of the semiconductor device with a nonzero bias voltage that is substantially fixed and has a value that is greater than a difference between the maximum voltage value and the voltage rating.

11. The read channel of claim 10, wherein the gate of the semiconductor device has a length that measures at least 150.0 nanometers and no more than 350.0 nanometers.

12. The read channel of claim 10, wherein the gate oxide layer has a thickness that measures at least 2.00 nanometers and no more than 7.00 nanometers.

13. The read channel of claim 10, wherein the semiconductor device is a MOSFET.

14. The read channel of claim 10, wherein the semiconductor device is manufactured using CMOS technology.

15. The read channel of claim 10, wherein the semiconductor device is manufactured using BiCMOS technology.

16. The read channel of claim 10, wherein the source and drain are biased to substantially equal voltages.

17. The read channel of claim 10, wherein the bias is selected such that a channel is strongly inverted.

18. The read channel of claim 10, further comprising a second bias supply that applies a reference voltage to a substrate of the semiconductor device that is different than the voltage applied to the source and drain.

19. An electrical circuit for amplification of a signal, comprising:

first circuit means having one of an input and an output for at least one of receiving and generating a voltage that varies and that has a maximum voltage value;

gate capacitance means for providing a capacitance and including a thin gate oxide layer semiconductor device with a gate, a source and a drain, wherein the gate communicates with the at least one of the input and the output of the first circuit, and wherein the semiconductor device has a voltage rating that is less than the maximum voltage value; and means for biasing the source and the drain of the semiconductor device with a nonzero bias voltage that is substantially fixed and has a value that is greater than a difference between the maximum voltage value and the voltage rating.

20. The circuit of claim 19, wherein the gate of the semiconductor device has a length that measures at least 150.0 nanometers and no more than 350.0 nanometers.

21. The circuit of claim 19, wherein the gate oxide layer has a thickness that measures at least 2.00 nanometers and no more than 7.00 nanometers.

22. The circuit of claim 19, wherein the semiconductor device is a MOSFET.

23. The circuit of claim 19, wherein the semiconductor device is manufactured using CMOS technology.

24. The circuit of claim 19, wherein the semiconductor device is manufactured using BiCMOS technology.

25. The circuit of claim 19, wherein the source and drain are biased to substantially equal voltages.

26. The circuit of claim 19, wherein the bias is selected such that a channel is strongly inverted.

27. The circuit of claim 19, further comprising means for applying a reference to a substrate of the semiconductor device different than the voltage applied to the source and drain.

28. An apparatus for using a gate capacitor, which has a voltage rating, without breakdown in a circuit that has an operating voltage that exceeds the voltage rating of the gate capacitor, comprising:

a gate capacitor including a thin gate oxide layer semiconductor device with a gate, a source and a drain;

a first circuit that has one of an input and an output that at least one of receives and generates, respectively, a voltage that varies and that has a maximum voltage value that exceeds the voltage rating of the gate capacitor;

a first bias supply that biases a source and a drain of the semiconductor device with a nonzero bias voltage that is substantially fixed and has a voltage value that is greater than a difference between the maximum voltage value and the voltage rating; and means for coupling the at least one of the input and the output of the first circuit to the gate of the semiconductor device.

29. The apparatus of claim 28, wherein the gate of the semiconductor device has a length that measures at least 150.0 nanometers and no more than 350.0 nanometers.

30. The apparatus of claim 28, wherein the gate oxide layer has a thickness that measures at least 2.00 nanometers and no more than 7.00 nanometers.

31. The apparatus of claim 28, wherein the semiconductor device is a MOSFET.

32. The apparatus of claim 28, wherein the semiconductor device is manufactured using CMOS technology.

33. The apparatus of claim 28, wherein the semiconductor device is manufactured using BiCMOS technology.

34. The apparatus of claims 28, wherein the source and drain are biased to substantially equal voltages.

35. The apparatus of claim 28, wherein the bias is selected such that a channel is strongly inverted.

36. The apparatus of claim 28, further comprising a second bias supply that applies a reference voltage to a substrate of the semiconductor device that is different than the voltage applied to the source and drain.

37. The method of claim 28, further comprising applying a reference to a substrate of the semiconductor device different than the voltage applied to the source and drain.

38. An apparatus for using a gate capacitor, which has a voltage rating, without breakdown in a circuit that has an operating voltage that exceeds the voltage rating of the gate capacitor, comprising:

gate capacitance means for providing a capacitance and including a thin gate oxide layer semiconductor device with a gate, a source and a drain;

first circuit means that has one of an input and an output for at least one of receiving and generating, respectively, a voltage that varies and that has a maximum voltage value that exceeds the voltage rating of the gate capacitor;

means for biasing the source and the drain of the semiconductor device with a nonzero bias voltage that is substantially fixed and has a voltage value that is greater than a difference between the maximum voltage value and the voltage rating; and means for applying a reference voltage to a substrate to which the semiconductor device is connected.

39. The apparatus of claim 38, wherein the gate of the semiconductor device has a length that measures at least 150.0 nanometers and no more than 350.0 nanometers.

40. The apparatus of claim 38, wherein the gate oxide layer has a thickness that measures at least 2.00 nanometers and no more than 7.00 nanometers.

41. The apparatus of claim 38, wherein the semiconductor device is a MOSFET.

42. The apparatus of claim 38, wherein the semiconductor device is manufactured using CMOS technology.

43. The apparatus of claim 38, wherein the semiconductor device is manufactured using BiCMOS technology.

44. The apparatus of claim 38, wherein the source and drain are biased to substantially equal voltages.

45. The apparatus of claim 38, wherein the bias is selected such that a channel is strong inverted.

46. A method for preventing breakdown of a gate capacitor, which has a voltage rating, when used in a circuit that has an operating voltage that exceeds the voltage rating of the gate capacitor, comprising:

providing a gate capacitor including a thin gate oxide layer semiconductor device with a gate, a source and a drain;

providing a first circuit that has one of an input and an output that at least one of receives and generates, respectively, a voltage that varies and that has a maximum voltage value that exceeds the voltage rating of the gate capacitor;

coupling the at least one of the input and the output of the first circuit to a gate of the semiconductor device; and biasing the source and the drain of the semiconductor device with a nonzero voltage that is substantially fixed and has a voltage value that is greater than a difference between the maximum voltage value and the voltage rating.

47. The method of claim 46, wherein the gate of the semiconductor device has a length that measures at least 150.0 nanometers and no more than 350.0 nanometers.

48. The method of claim 46, wherein the gate oxide layer has a thickness that measures at least 2.00 nanometers and no more than 7.00 nanometers.

49. The method of claim 46, wherein the semiconductor device is a MOSFET.

50. The method of claim 46, wherein the semiconductor device is manufactured using CMOS technology.

51. The method of claim 46, wherein the semiconductor device is manufactured using BiCMOS technology.

52. The method of claim 46, wherein the source and drain are biased to substantially equal voltages.

53. The method of claim 46, wherein the bias is selected such that a channel is strongly inverted.

54. A method for preventing breakdown of a gate capacitor, which has a voltage rating, when used in a circuit that has an operating voltage that exceeds the voltage rating of the gate capacitor, comprising:

providing a gate capacitor including a thin gate oxide layer semiconductor device with a gate, a source and a drain;

providing a first circuit that has one of an input and an output that at least one of receives and generates, respectively, a voltage that varies and that has a maximum voltage value that exceeds the voltage rating of the gate capacitor;

coupling the at least one of the input and the output of the first circuit to a gate of the semiconductor device;

biasing the source and the drain of the semiconductor device with a nonzero voltage that is substantially fixed and has a voltage value that is greater than a difference between the maximum voltage value and the voltage rating; and applying a reference voltage to a substrate of the semiconductor device.

55. The method of claim 54, wherein the gate of the semiconductor device has a length that measures at least 150.0 nanometers and no more than 350.0 nanometers.

56. The method of claim 54, wherein the gate oxide layer has a thickness that measures at least 2.00 nanometers and no more than 7.00 nanometers.

57. The method of claim 54, wherein the semiconductor device is a MOSFET.

58. The method of claim 54, wherein the semiconductor device is manufactured using CMOS technology.

59. The method of claim 54, wherein the semiconductor device is manufactured using BiCMOS technology.

60. The method of claim 54, wherein the source and drain are biased to substantially equal voltages.

61. The method of claim 54, wherein the bias is selected such that a channel is strongly inverted.

* * * * *